United States Patent
Lee

(10) Patent No.: US 7,318,175 B2
(45) Date of Patent: Jan. 8, 2008

(54) MEMORY MODELING CIRCUIT WITH FAULT TOLERATION

(75) Inventor: Chin Lee, Taipei (TW)

(73) Assignee: Via Technologies, Inc., Taipei (TW)

( * ) Notice: Subject to any disclaimer, the term of this patent is extended or adjusted under 35 U.S.C. 154(b) by 812 days.

(21) Appl. No.: 10/620,456

(22) Filed: Jul. 17, 2003

(65) Prior Publication Data

US 2004/0153912 A1    Aug. 5, 2004

(30) Foreign Application Priority Data

Nov. 29, 2002    (TW) .............................. 91134866 A

(51) Int. Cl.
  *G06F 11/00*    (2006.01)
(52) U.S. Cl. ...................... 714/42; 714/54; 714/797
(58) Field of Classification Search ................ 714/718, 714/797, 42
  See application file for complete search history.

(56) References Cited

U.S. PATENT DOCUMENTS

| | | | | |
|---|---|---|---|---|
| 4,375,683 A | * | 3/1983 | Wensley ....................... | 714/12 |
| 4,628,509 A | * | 12/1986 | Kawaguchi .................. | 714/711 |
| 4,794,601 A | * | 12/1988 | Kikuchi ....................... | 714/758 |
| 5,757,809 A | * | 5/1998 | Kiso et al. ................... | 714/718 |
| 6,009,026 A | * | 12/1999 | Tamlyn et al. .............. | 365/201 |
| 6,957,371 B2 | * | 10/2005 | Ricchetti et al. ............ | 714/733 |
| 7,013,414 B2 | * | 3/2006 | Takeshige et al. .......... | 714/719 |
| 7,047,455 B2 | * | 5/2006 | Roohparvar ................. | 714/710 |
| 7,137,050 B2 | * | 11/2006 | Merritt et al. ............... | 714/719 |
| 2003/0204797 A1 | * | 10/2003 | Lin ............................. | 714/718 |

FOREIGN PATENT DOCUMENTS

JP            06150698 A    *    5/1994

* cited by examiner

*Primary Examiner*—Nadeem Iqbal
*Assistant Examiner*—Paul F Contino
(74) *Attorney, Agent, or Firm*—Birch, Stewart, Kolasch & Birch, LLP

(57) ABSTRACT

A memory modeling circuit with fault toleration includes a compare circuit, a control circuit and a test circuit. The compare circuit receives the data stored in the same address of memories and compares data with each other to produce the correct reading data. The control circuit connects with the control signals of the memories and detects that control signals. The control circuit has data output/input ports. When the control signal of the memories is to write, the control circuit enters a writing mode and writes the writing data received from the data output/input ports in the same address of the memories. When the control signal of the memories is to read, the control circuit enters a reading mode, receiving the reading data generated by the compare circuit and outputs it through the data output/input ports. The test circuit receives the data stored in the same address of the memories and the reading data generated by the compare circuit to generate a testing result. The testing result can identify a faulty memory or a faulty compare circuit.

16 Claims, 9 Drawing Sheets

| Input | | | Output |
|---|---|---|---|
| I1(I4,I7,IA) | I2(I5,I8,IB) | I3(I6,I9,IC) | OA(1A,2A,3A) |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

| Output | | | | | | Corresponding results |
|---|---|---|---|---|---|---|
| $C_0$ | $C_1$ | $C_2$ | $C_3$ | $C_4$ | $C_5$ | |
| 0 | 0 | 0 | 0 | 0 | 0 | Normal |
| 1 | 0 | 0 | 1 | 1 | 0 | I2(second memory)occurs error |
| 1 | 1 | 1 | 0 | 0 | 0 | I1(first memory)occurs error |
| 0 | 1 | 0 | 1 | 0 | 1 | I3(third memory)occurs error |
| 0 | 0 | 1 | 0 | 1 | 1 | OA(first compare circuit) occurs error |

FIG.3A

| Output | | | | | | Corresponding results |
|---|---|---|---|---|---|---|
| $C_6$ | $C_7$ | $C_8$ | $C_9$ | $C_A$ | $C_B$ | |
| 0 | 0 | 0 | 0 | 0 | 0 | Normal |
| 1 | 0 | 0 | 1 | 1 | 0 | I5(second memory)occurs error |
| 1 | 1 | 1 | 0 | 0 | 0 | I4(first memory)occurs error |
| 0 | 1 | 0 | 1 | 0 | 1 | I6(third memory)occurs error |
| 0 | 0 | 1 | 0 | 1 | 1 | 1A(second compare circuit) occurs error |

FIG.3B

| Output | | | | | | Corresponding results |
|---|---|---|---|---|---|---|
| Cc | Cd | Ce | Cf | Cg | Ch | |
| 0 | 0 | 0 | 0 | 0 | 0 | Normal |
| 1 | 0 | 0 | 1 | 1 | 0 | 18(second memory)occurs error |
| 1 | 1 | 1 | 0 | 0 | 0 | 17(first memory)occurs error |
| 0 | 1 | 0 | 1 | 0 | 1 | 19(third memory)occurs error |
| 0 | 0 | 1 | 0 | 1 | 1 | 2A(third compare circuit) occurs error |

FIG.3C

| Output | | | | | | Corresponding results |
|---|---|---|---|---|---|---|
| Ci | Cj | Ck | Cl | Cm | Cn | |
| 0 | 0 | 0 | 0 | 0 | 0 | Normal |
| 1 | 0 | 0 | 1 | 1 | 0 | 1B(second memory)occurs error |
| 1 | 1 | 1 | 0 | 0 | 0 | 1A(first memory)occurs error |
| 0 | 1 | 0 | 1 | 0 | 1 | 1C(third memory)occurs error |
| 0 | 0 | 1 | 0 | 1 | 1 | 3A(fourth compare circuit) occurs error |

| X | Y | X' | Y' | X" | Y" | PQ | left K | left L | Memory read/write |
|---|---|----|----|----|----|----|--------|--------|-------------------|
| 0 | 0 | —  | —  | —  | —  | —  | —      | —      | No any Read/Write |
| 0 | 1 | —  | —  | —  | —  | 01 | 1      | 0      | Write |
| 0 | 0 | 0  | 1  | —  | —  | 01 | 1      | 0      | After Write, X=0  Y=0 turned up |
| 0 | 0 | 0  | 0  | 0  | 1  | 01 | 1      | 0      | After Write,hold X=0  Y=0 |
| 1 | 0 | 0  | 1  | —  | —  | 10 | 0      | 1      | After Write,Read turned up immediately |
| 0 | 0 | 1  | 0  | 0  | 1  | 10 | 0      | 1      | After Write,Read turned up immediately and then X=0 Y=0 turned up |
| 0 | 0 | 1  | 0  | 0  | 0  | 01 | 1      | 0      | After Write,Read turned up and then Write turned up |
| 1 | 0 | 1  | 0  | 0  | 1  | 11 | 0      | 1      | After Write,hold Read |
| 0 | 1 | 0  | 1  | —  | —  | 01 | 1      | 0      | After Write,Write turned up again |
| 0 | 0 | 0  | 0  | 0  | 1  | 01 | 1      | 0      | After Write,Write turned up again and then X=0 Y=0 turned up |
| 1 | 0 | 0  | 1  | —  | —  | 10 | 0      | 1      | After Write,Write turned up again and then Read turned up |
| 1 | 0 | —  | —  | —  | —  | 10 | 0      | 1      | Read |
| 0 | 0 | 1  | 0  | —  | —  | 10 | 0      | 1      | After Read, X=0  Y=0 turned up |
| 0 | 0 | 0  | 0  | 1  | 0  | 10 | 0      | 1      | After Read,hold X=0  Y=0 |
| 0 | 1 | 1  | 0  | —  | —  | 01 | 1      | 0      | After Read,Write turned up |

FIG.6A

| | | | | | | | | | Description |
|---|---|---|---|---|---|---|---|---|---|
| 0 | 0 | 1 | 1 | 0 | 0 | 1 | 0 | 1 | 0 | After Read, Write turned up immediately and then X=0 Y=0 turned up |
| 1 | 0 | 0 | 1 | 1 | 0 | 1 | 0 | 1 | 0 | After Read, hold Write |
| 0 | 0 | 1 | 1 | 0 | 1 | 0 | 0 | 0 | 1 | After Read, Write turned up and then Read turned up |
| 1 | 0 | 0 | 1 | 0 | 1 | 1 | 0 | 0 | 1 | After Read, hold Read |
| 0 | 1 | 1 | 0 | 1 | 0 | 0 | 0 | 0 | 1 | After Read, Read turned up again and then X=0 Y=0 turned up |
| 0 | 1 | 1 | 0 | 0 | 1 | 0 | 0 | 1 | 0 | After Read, Read turned up again and then Write turned up |
| 1 | 0 | 0 | 1 | 0 | 1 | 0 | 0 | 1 | 0 | After Read, X=0 Y=0 turned up and then Write turned up |
| 0 | 0 | 1 | 1 | 1 | 0 | 0 | 0 | 0 | 1 | After Read, X=0 Y=0 turned up and then Read turned up |

MEMORY MODELING CIRCUIT WITH FAULT TOLERATION

This nonprovisional application claims priority under 35 U.S.C. § 119 (a) on Patent Application No(s). 091134866 filed in TAIWAN, R.O.C. on Nov. 29, 2002, which is herein incorporated by reference.

BACKGROUND OF THE INVENTION

1. Field of the Invention

This invention generally relates to the field of a design for a fault toleration circuit. More particularly, the present invention relates to a memory modeling circuit with fault toleration.

2. Description of the Prior Art

Many devices require memory systems with high reliability, such as servers in enterprises or government offices; mainframes in financial institutions; equipment in hospitals; navigation systems for aircrafts or spaceships; even the devices used in severe environments. The memory systems with high reliability are required in order to ensure the accuracy of data and make whole system work regularly since the memory systems in those devices are used in storing important data.

In order to improve the reliability of memories, well-known methods are to add testing items to memories for picking those defected out before their leaving the factor; to disable or discard error bit and even to correct it by software detecting/debugging.

Although the reliability of memory can be effectively improved in real time by software detecting/debugging, the only one way is to replace a new one while the data stored in the memory occurs numerous errors. As to other methods, they cannot detect error in real time but only compensation.

This is, one bit error or a few data errors can be processed in real time by adopting software detecting/debugging method. However, the whole system will shut down and lose the important data stored in memory while numerous data errors occur in the memory. As to other methods, they only can improve the product reliability in the future by analyzing the historical errors but cannot deal with the error in real time.

Therefore, there is a need for providing a memory modeling circuit with fault toleration that can detect and correct error(s) in real time.

SUMMARY OF THE INVENTION

In accordance with the present invention, a memory modeling circuit with fault toleration is provided and substantially obviates one or more of the problems resulted from limitations and disadvantages of the prior art mentioned in the background.

Accordingly, one object of the present invention is to provide a memory modeling circuit with fault toleration for detecting and correcting the error(s) in a memory system.

Another object is to provide a memory modeling circuit with fault toleration for detecting the faulty memory.

Still another object is to provide a memory modeling circuit with fault toleration for improving the reliability of a memory system.

According to the objects mentioned above, the present invention provides a memory modeling circuit with fault toleration, including: a compare circuit, a control circuit and a test circuit. The compare circuit receives the data stored in the same address of memories and compares data with each other to produce the correct reading data. The control circuit connects with the control signals of memories and detects that control signals. The control circuit has data output/input ports. While the control signal of the memories is to write, the control circuit enters a writing mode and writes the writing data received from the data output/input ports in the same address of the memories. While the control signal of the memories is to read, the control circuit enters a reading mode, receiving the reading data generated by the compare circuit and outputs it through the data output/input ports. The test circuit receives the data stored in the same address of the memories and the reading data generated by the compare circuit to generate a testing result. The testing result can identify a faulty memory or a faulty compare circuit.

The compare circuit or the test circuit can include several sub-circuits with the same circuit design. Further, while the control circuit is in a writing mode, it stops receiving the data sent from the compare circuit until the control circuit enters a reading mode. While the control circuit is in a reading mode, it makes the compare circuit stop writing data to memories until the control circuit enters a writing mode.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description, and the accompanying drawings, which are given by way of illustration only, and thus are not limitative of the present invention, and wherein:

FIGS. 3A to 3D show the output results and the corresponding errors to the test circuit in FIG. 1B;

FIGS. 6A and 6B illustrate a logic truth table and the status of memory reading/writing for the circuit in FIG. 5.

DESCRIPTION OF THE PREFERRED EMBODIMENT

Some preferred embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

The present invention provides a memory modeling circuit with fault toleration, including: a compare circuit, a control circuit and a test circuit. The compare circuit receives the data stored in the same address of memories and compares data with each other to produce the correct reading data. The control circuit connects with the control signals of the memories and detects that control signals. The control circuit has data output/input ports. While the control signal of the memories is to write, the control circuit enters a writing mode and writes the writing data received from the data output/input ports in the same address of memories. While the control signal of the memories is to read, the control circuit enters a reading mode, receiving the reading data generated by the compare circuit and outputs it through the data output/input ports. The test circuit receives the data stored in the same address of the memories and the reading data generated by the compare circuit to generate a testing result. The testing result can identify a faulty memory or a faulty compare circuit.

The compare circuit or the test circuit can include several sub-circuits with the same circuit design. Further, while the control circuit is in a writing mode, it stops receiving the data sent from the compare circuit until the control circuit enters a reading mode. While the control circuit is in a reading mode, it makes the compare circuit stop writing data to memories until the control circuit enters a writing mode.

Figure 1A:
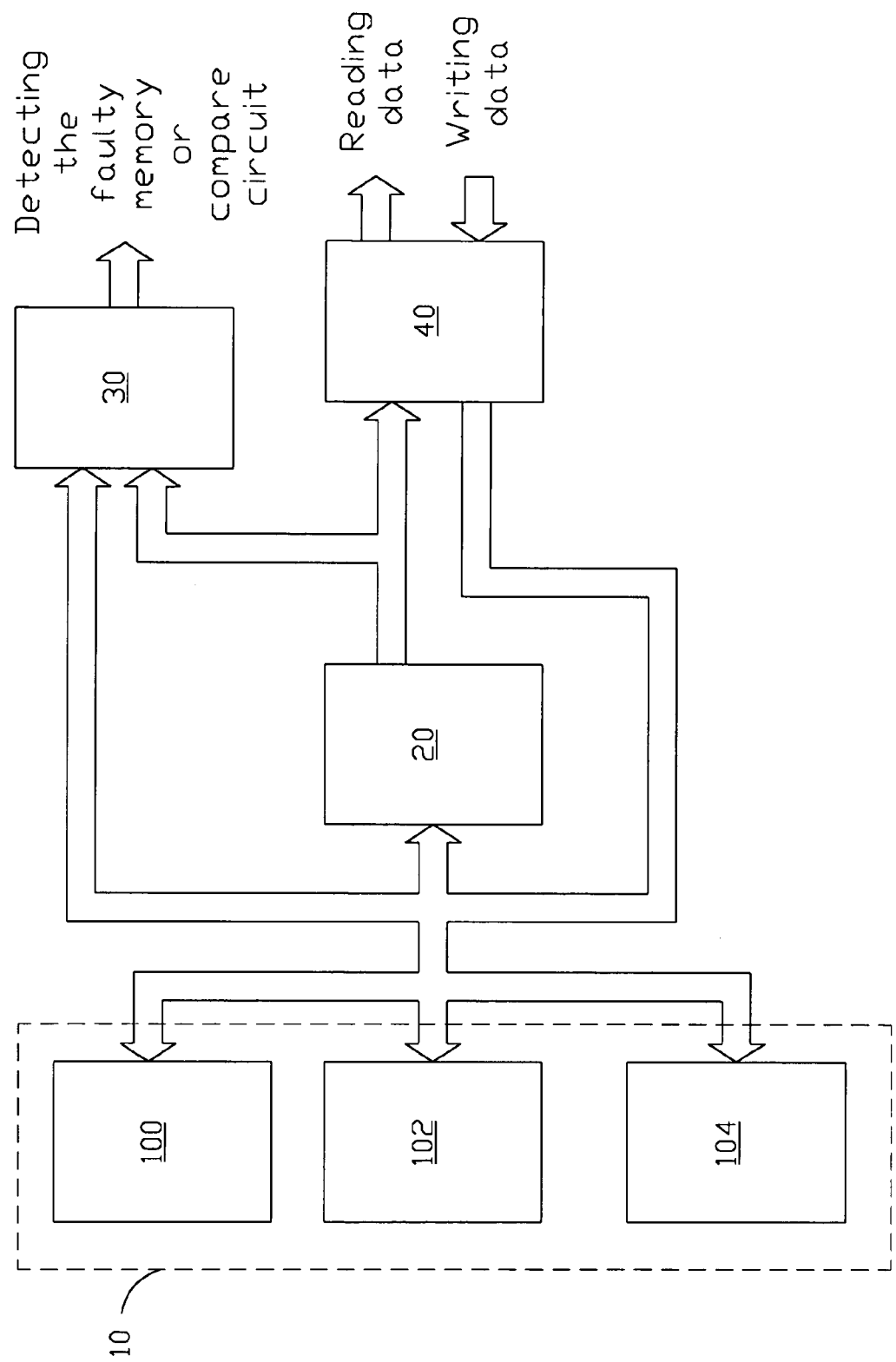
FIG. 1A illustrates a block diagram in accordance with the concept of the present invention.

FIG. 1A illustrates the concept of the present invention. While data will be written to the memory 10, the control circuit 40 receives the writing data and writes it to the same address of the first memory 100, the second memory 102 and the third memory 104 at the same time. While data will be read from the memory 10, the reading data is read from the same address of the first memory 100, the second memory 102 and the third memory 104, being sent to the compare circuit 20 to compare with each other to ensure the accuracy of itself, and is outputted through the control circuit 40.

The present invention further discloses that the test circuit 30 simultaneously receives the data from the memory 10 and the compare circuit 20 in order to identify the fault part among the first memory 100, the second memory 102, the third memory 104 and the compare circuit 20 while any fault occurs in the reading process.

Figure 1B:
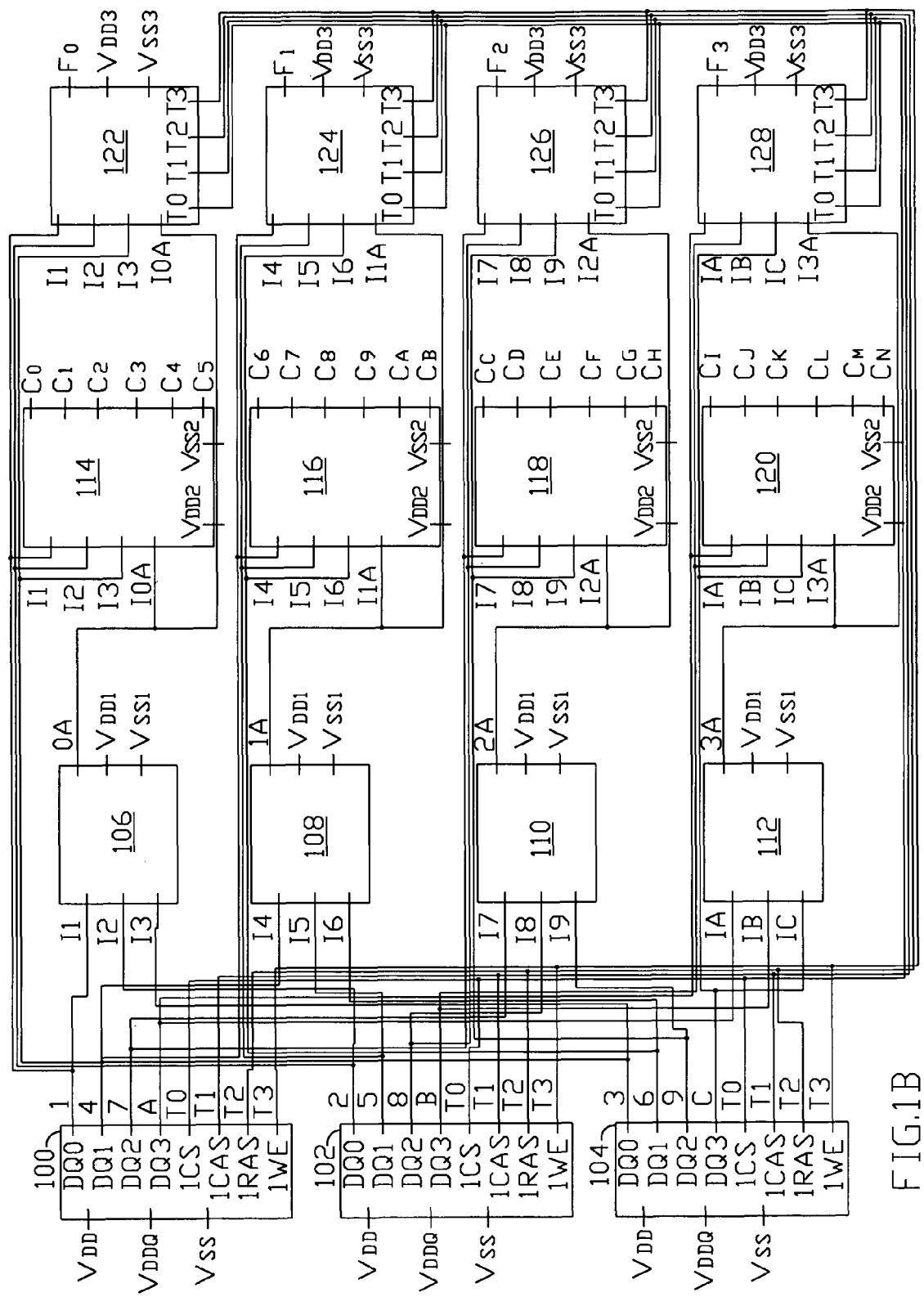
FIG. 1B illustrates one preferred circuit embodiment of the present invention.

FIG. 1B illustrates one preferred embodiment of the present invention. The first memory 100, the second memory 102 and the third memory 104 use the same type of memory and simultaneously store the same data. In the present preferred embodiment, the first memory 100, the second memory 102 and the third memory 104 use the synchronous dynamic random access memory (SDRAM). The output/input ports DQ0 of the first memory 100, the second memory 102 and the third memory 104 are respectively connected with the input ports I1, I2 and I3 of the first compare circuit, as shown in FIG. 1B.

The data stored in the first memory 100, the second memory 102 and the third memory 104, theoretically, should be the same while there is no any fault. The first compare circuit 106 compares with the data sent from the output/input ports DQ0 of the memories. For example, assuming the correct data of the three output/input ports DQ0 is "1". While all output data are "1" or any two of them are "1", the correct output "1" still can be gotten through the operation of the first compare circuit 106. This is, the compare circuit of the present invention can detect and tolerate a faulty memory. This means the correct output data can be gotten through the compare circuit unless two faults occur simultaneously on the output/input ports DQ0 among the first memory 100, the second memory 102 and the third memory 104.

Similarly, the output/input ports DQ1 of the first memory 100, the second memory 102 and the third memory 104 are respectively connected with the input ports I4, I5 and I6 of the second compare circuit; the output/input ports DQ2 are respectively connected with the input ports I7, I8 and I9 of the third compare circuit; the output/input ports DQ3 are respectively connected with the input ports IA, IB and IC of the fourth compare circuit, as shown in FIG. 1B.

Figures 2A, 2B:
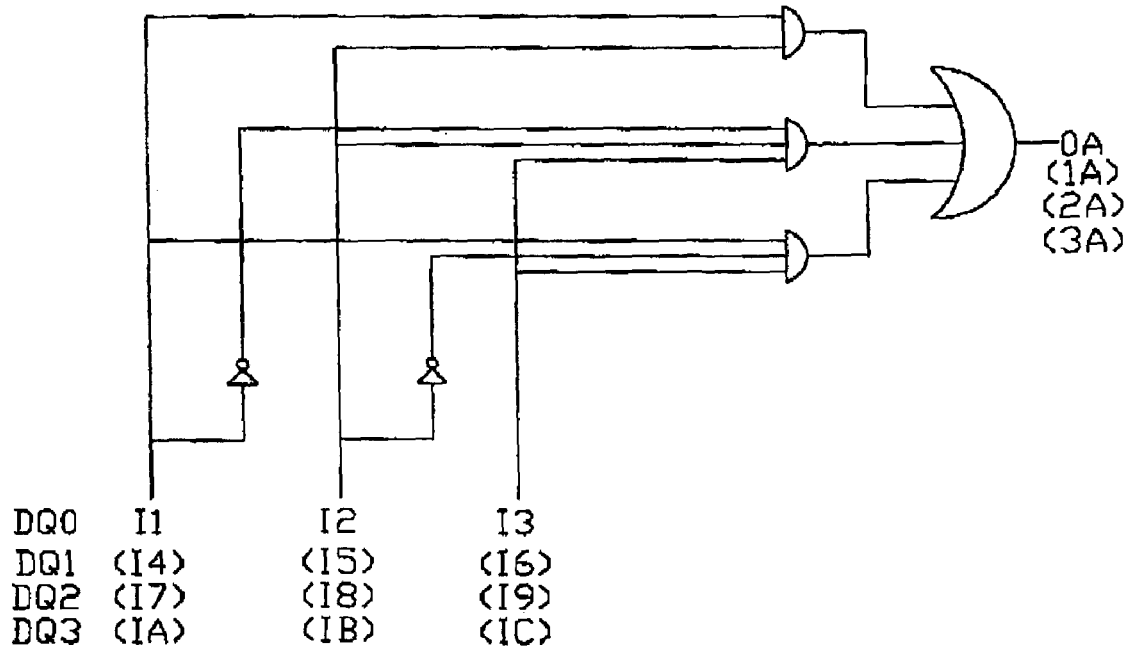
FIG. 2A shows a logic circuit of the compare circuit in FIG. 1B.
FIG. 2B shows a logic truth table of the circuit in FIG. 2A.

FIG. 2A shows a circuit diagram of the compare circuit described above, and FIG. 2B shows the logic truth table of the compare circuit in FIG. 2A. However, the compare circuit in FIG. 2A is one preferred circuit for the present embodiment, and other logic circuits to produce the result of the truth table in FIG. 2B also can be applied to other embodiments.

Furthermore, the present invention can not only detect and correct the fault data but also identify the faulty memory or compare circuit in order to let an engineer repair the fault part in real time to keep the reliability of memory system.

Referring to FIG. 1B again, the first test circuit 114 has four input ports respectively connected with three input ports I1, I2, and I3, and one output port 0A of the previous stage first compare circuit 106, and has output ports named from C0 to C5. While the outputs as shown in FIG. 3A respectively appear on the ports C0 to C5 of the first test circuit 114, the faulty memory or compare circuit can be identified. For example, while the output ports C0 to C5 of the first test circuit 114 are "C0=1, C1=0, C2=0, C3=1, C4=1, C5=0", the output port DQ0 (I2) of the second memory 102 is fault according to FIG. 3A. Another example, while the output ports C0 to C5 of the first test circuit 114 are "C0=0, C1=0, C2=1, C3=0, C4=1, C5=1", the output port 0A of the compare circuit 106 is fault according to FIG. 3A.

Figure 4:
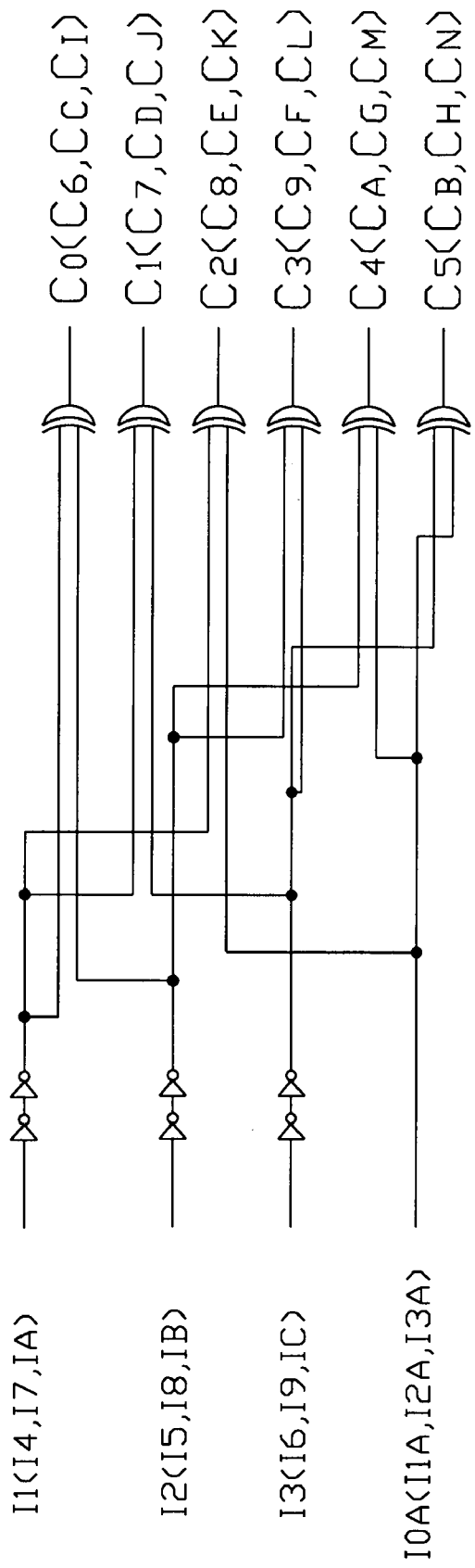
FIG. 4 shows a logic circuit of the test circuit in FIG. 1B.

Similarly, the second test circuit 116 has four input ports respectively connected with three input ports I4, I5, and I6, and one output port 1A of the second compare circuit 108, and has output ports named from C6 to CB. The third test circuit 118 has four input ports respectively connected with three input ports I7, I8, and I9, and one output port 2A of the second compare circuit 110, and has output ports named from CC to CH. The fourth test circuit 120 has four input ports respectively connected with three input ports IA, IB, and IC, and one output port 3A of the fourth compare circuit 112, and has output ports named from CI to CN. Moreover, the same method as described in the first test circuit 114, the faulty memory or compare circuit can be identified according to the outputs of the second test circuit 116, the third test circuit 118 and the fourth test circuit 120. FIG. 4 shows a preferred logic circuit embodiment of the test circuit in FIG. 1B.

Referring to FIG. 1B again, since reading from or writing to memory is through the same ports, such as the data read from or written to the first memory 100 is through the same ports DQ0~DQ3, the first control circuit 122, the second control circuit 124, the third control circuit 126 and the fourth control circuit 128 are used in controlling the output/input ports of the respective memory in reading mode or writing mode.

For example, while the memories is in a writing mode, the statuses of the control signal ports T0 to T3 respectively are 1CS(T0)=0, 1CAS(T1)=0, 1RAS(T2)=1 and 1WE(T3)=0. At this moment, the first control circuit 122 senses the memories in the writing mode through its ports, T0, T1, T2 and T3, connected with the ports, T0, T1, T2 and T3, of the control signal ports of the memories, hence the first control circuit 122 enters the writing mode. Moreover, while the first control circuit 122 is in the writing mode, the port F0 is used in receiving writing data and respectively connecting with the ports DQ0 of the first memory 100, the second memory 102 and the third memory 104 through the ports, I1, I2 and I3, of the first control circuit 122 in order to write the data of the port F0 to the memories. As shown in FIG. 1B, the port I0A of the first control circuit 122 is connected with the port 0A of the first compare circuit to get the correct output data through the compare circuit. However, while the first control circuit is in a writing mode, the port I0A will be disabled from receiving data firstly.

On the other hand, while the memories is in a reading mode, the statuses of the control signal ports T0 to T3 respectively are 1CS(T0)=0, 1CAS(T1)=0, 1RAS(T2)=1 and 1WE(T3)=1, and the first control circuit 122 is switched to the reading mode. At this moment, the port I0A of the first control circuit 122 receives reading data from the port 0A of the first compare circuit and outputs the data through the port F0 of the first control circuit 122. The ports, I1, I2 and I3, will be disabled while the first control circuit is in a reading mode.

As described above, while the ports, F0, F1, F2 and F3, of the first control circuit 122, the second control circuit 124, the third control circuit 126 and the fourth control circuit 128 are used in receiving writing data, the control circuits disable the ports I0A, I1A, I2A, I3A and respectively connect with the ports DQ0, DQ1, DQ2 and DQ3 of the memories through the ports I1, I2, I3, I4, I5, I6, I7, I8, I9, IA, IB and IC, to write data into the memories, as shown in FIG. 1B. While the ports, F0, F1, F2 and F3 are used in receiving reading data, the control circuits disable the ports I1, I2, I3, I4, I5, I6, I7, I8, I9, IA, IB and IC, receiving the correct data at the ports I0A, I1A, I2A, I3A from the compare circuits and output the reading data through the ports F0, F1, F2 and F3 of the control circuits.

Figure 5:
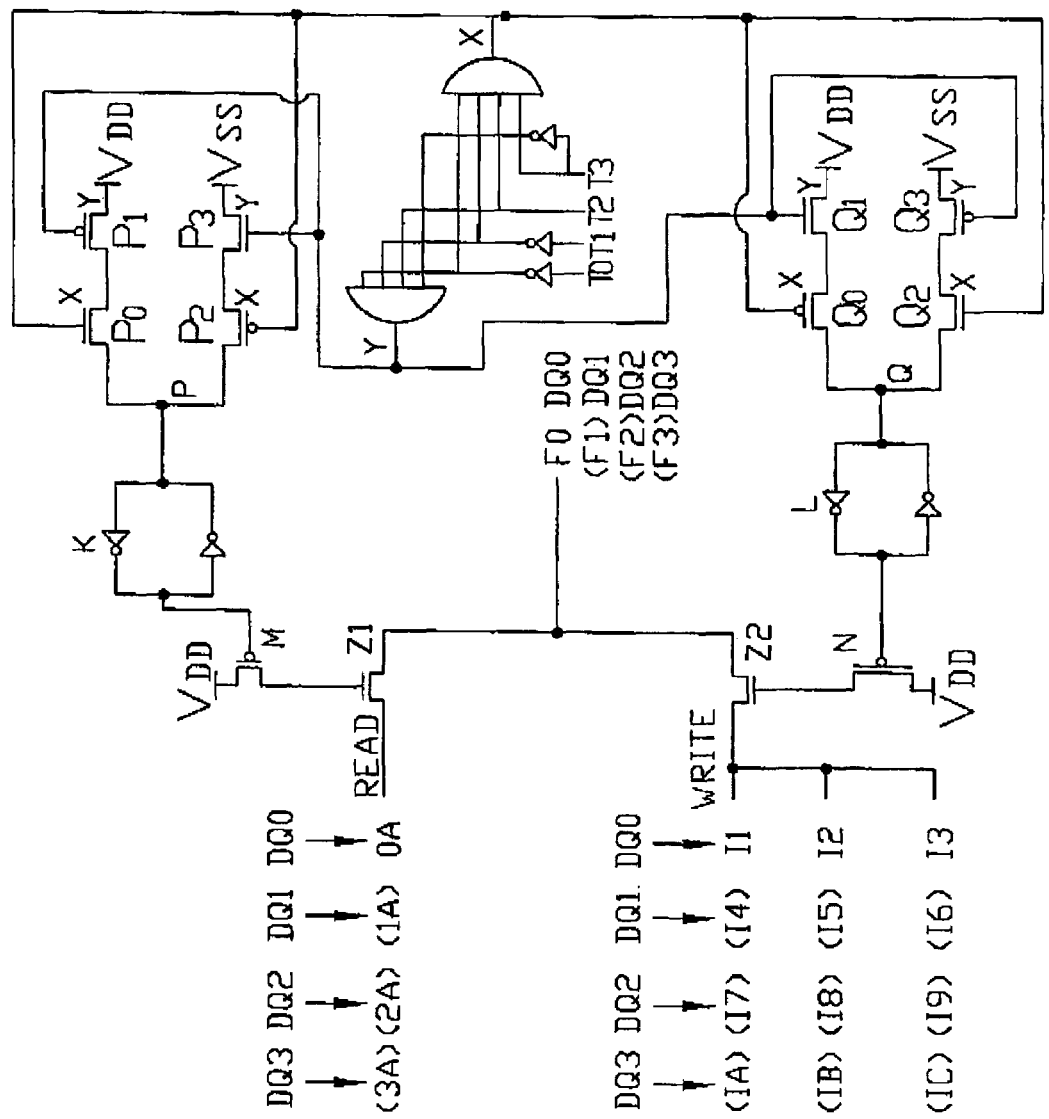
FIG. 5 shows a logic circuit of the control circuit in FIG. 1B.

FIG. 5 shows a logic circuit example of the control circuit in accordance with the present invention. FIGS. 6A and 6B show the logic truth table of the control circuit in FIG. 5, and the statuses of memory reading/writing. As shown in FIG. 5, as X=1 and Y=0, the control circuit enters a reading mode. P2 and P3 are turned off but P0 and P1 are turned on to make the connection point P be "1". Q0 and Q1 are turned off but Q2 and Q3 are turned on to make the connection point Q be "0". Hence, the left side of the K is "0" and the left side of the L is "1" to make the N turn off but the M turn on. While the status of X=0 and Y=0 in reading data process, Q1 and Q2 are turned off to make the voltage of the connection point Q retain in the status of X=1 and Y=0 so that the left side of the L is still "1"; also, P0 and P3 are turned off to make the voltage of the connection point P retain in the status of X=1 and Y=0 so that the left side of the K is still "0". The reading mode is still hold by the control circuits until the status is changed to X=0 and Y=1. Meanwhile, P2 and P3 are turned on but P0 and P1 are turned off so that the connection point P is "0"; also, Q0 and Q1 are turned on but Q2 and Q3 are turned off so that the connection point Q is "1". This makes the left side of the K is "1" and the left side of the L is "0". This makes the N be turned on but the M be turned off. While the status of X=0 and Y=0 occurs in writing mode, Q1 and Q2 are turned off to make the voltage of the connection point Q retain in the status of X=0 and Y=1 so that the left side of the L is "0"; also, P0 and P3 are turned off to make the voltage of the connection point P retain in the status of X=0 and Y=1 so that the left side of the K is "1". This makes the writing mode is hold by the control circuits until the next change.

Although specific embodiments have been illustrated and described, it will be obvious to those skilled in the art that various modifications may be made without departing from what is intended to be limited solely by the appended claims.

What is claimed is:

1. A memory modeling circuit with fault toleration, comprising:
a compare circuit, used to compare memory data stored in the same address in a plurality of memories, wherein the compare circuit compares at least three data inputs from different memories, wherein if the data inputs are divided into a first kind data and a second kind data and if the count of the first kind data outnumbers that of the second kind data, the compare circuit will output the first kind data; and
a control circuit coupled to said plurality of memories, wherein said control circuit controls said memory data to be read or written from/to said plurality of memories, wherein said control circuit is able to receive the first kind data from said compare circuit and is unable to receive said memory data from said plurality of memories while said control circuit is in the reading mode.

2. The memory modeling circuit according to claim 1, further comprising:
a test circuit, receiving said memory data and the first kind data generated by said compare circuit to generate a testing result.

3. The memory modeling circuit according to claim 2, wherein said test circuit further comprises a plurality of sub-test circuits with the same circuit design.

4. The memory modeling circuit according to claim 3, wherein said testing result gets an error code and then a faulty memory or a faulty sub-test circuit can be identified according to said error code.

5. The memory modeling circuit according to claim 1, wherein said plurality of memories are the same type of memory.

6. The memory modeling circuit according to claim 5, wherein said memory is synchronous dynamic random access memory (SDRAM).

7. The memory modeling circuit according to claim 1, wherein said compare circuit further comprises a plurality of sub-compare circuits wit the same circuit design.

8. The memory modeling circuit according to claim 1, wherein said control circuit is unable to receive the first kind data sent from said compare circuit while said control circuit is in the writing mode.

9. A memory modeling circuit with fault toleration, comprising:
a compare circuit, used to receive memory data stored in the same address in a plurality of memories, wherein the compare circuit compares at least three data inputs from different memories, wherein if the data inputs are divided into a first kind data and a second kind data and if the count of the first kind data outnumbers that of the second kind data, the compare circuit will output the first kind data;
a control circuit connecting said plurality of memories, wherein said control circuit can enter a writing mode and writes information to the same address in said plurality of memories or enter a reading mode to load data from said compare circuit; and
a test circuit receiving the memory data stored in the same address in said plurality of memories and the first kind data generated by said compare circuit to generate a testing result, wherein said control circuit is able to receive the first kind data from said compare circuit and is unable to receive said memory data from said plurality of memories while said control circuit is in the reading mode.

10. The memory modeling circuit according to claim 9, wherein said test circuit further comprises a plurality of sub-test circuits with the same circuit design.

11. The memory modeling circuit according to claim 10, wherein said testing result can identify a faulty memory or a faulty sub-test circuit.

12. The memory modeling circuit according to claim 9, wherein said compare circuit further comprises a plurality of sub-compare circuits with the same circuit design.

13. The memory modeling circuit according to claim 9, wherein said testing result gets an error code and then an engineer knows the fault part according to different error code combinations and repairs said fault part to keep the reliability.

14. The memory modeling circuit according to claim 9, wherein said plurality of memories are the same typo of memory.

15. The memory modeling circuit according to claim 14, wherein said memory is synchronous dynamic random access memory (SDRAM).

16. The memory modeling circuit according to claim 9, wherein said control circuit is unable to receive the first kind data sent from said compare circuit while said control circuit is in the writing mode.

* * * * *